United States Patent
Cho et al.

(10) Patent No.: US 12,526,919 B2
(45) Date of Patent: Jan. 13, 2026

(54) PRINTED CIRCUIT BOARD

(71) Applicant: SAMSUNG ELECTRO-MECHANICS CO., LTD., Suwon-si (KR)

(72) Inventors: Sangik Cho, Suwon-si (KR); Mi Jung Park, Suwon-si (KR); Mi Geum Kim, Suwon-si (KR); Yong Su Lee, Suwon-si (KR); Sung Han, Suwon-si (KR); Jong Eun Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 167 days.

(21) Appl. No.: 18/138,893

(22) Filed: Apr. 25, 2023

(65) Prior Publication Data

US 2024/0196528 A1    Jun. 13, 2024

(30) Foreign Application Priority Data

Dec. 8, 2022  (KR) .......................... 10-2022-0170860

(51) Int. Cl.
| | |
|---|---|
| *H05K 1/09* | (2006.01) |
| *H05K 1/05* | (2006.01) |
| *H05K 1/11* | (2006.01) |
| *H05K 3/18* | (2006.01) |

(52) U.S. Cl.
CPC ............... *H05K 1/09* (2013.01); *H05K 1/056* (2013.01); *H05K 1/116* (2013.01); *H05K 3/181* (2013.01)

(58) Field of Classification Search
CPC ........... H05K 1/056; H05K 1/111–116; H05K 3/4069; H05K 3/0035; H05K 1/188; H01L 21/4857
USPC ......................................................... 174/255
See application file for complete search history.

(56) References Cited

U.S. PATENT DOCUMENTS

| | | | |
|---|---|---|---|
| 2006/0070769 A1 | 4/2006 | Kim | |
| 2007/0205520 A1* | 9/2007 | Chou | H01L 24/12 |
| | | | 257/E23.129 |
| 2009/0188806 A1* | 7/2009 | Yamasaki | H05K 3/108 |
| | | | 205/122 |

(Continued)

FOREIGN PATENT DOCUMENTS

| | | |
|---|---|---|
| JP | 2015-082598 A | 4/2015 |
| JP | 2015-177163 A | 10/2015 |

(Continued)

*Primary Examiner* — Stanley Tso
*Assistant Examiner* — Sidi M Maiga
(74) *Attorney, Agent, or Firm* — Morgan, Lewis & Bockius LLP (57) ABSTRACT

A printed circuit board includes: a first metal layer; an organic insulating layer covering at least a portion of the first metal layer and having a via hole exposing at least a portion of an upper surface of the first metal layer; a first seed metal layer disposed on an upper surface of the organic insulating layer; a second seed metal layer disposed on the first seed metal layer and extending onto a wall surface of the via hole and the exposed upper surface of the first metal layer; and a second metal layer disposed on the second seed metal layer and filling at least a portion of the via hole, wherein the first seed metal layer includes a first sputtering layer including titanium (Ti), and the second seed metal layer includes an electroless plating layer.

20 Claims, 8 Drawing Sheets

(56) References Cited

U.S. PATENT DOCUMENTS

2013/0180766 A1* 7/2013 Lee .................. H05K 3/3463
174/255

FOREIGN PATENT DOCUMENTS

| KR | 10-2006-0030310 A | 4/2006 |
| KR | 10-2015-0083344 A | 7/2015 |

* cited by examiner

PRINTED CIRCUIT BOARD

CROSS-REFERENCE TO RELATED APPLICATION (S)

This application claims benefit of priority to Korean Patent Application No. 10-2022-0170860 filed on Dec. 8, 2022 in the Korean Intellectual Property Office, the disclosure of which is incorporated herein by reference in its entirety.

BACKGROUND

1. Field

The present disclosure relates to a printed circuit board.

2. Description of Related Art

Chiplet technology is emerging in accordance with a limitation in increasing a size of a semiconductor chip to cope with the implementation of multifunctionality and high performance therein, and accordingly, a wiring of a package board has a gradually smaller line with or separation distance. In a semi-additive process (SAP) method, it is necessary to minimize an amount of flash etching by forming a thin seed layer in order to respond to such miniaturization. The thin seed layer for this purpose may require high adhesion to an insulating material having low roughness and an excellent coverage property in a via hole.

SUMMARY

An aspect of the present disclosure may provide a printed circuit board including an organic insulating layer and a seed metal layer which may have high adhesion and may simultaneously have an excellent coverage property in a via hole.

The present disclosure may provide a printed circuit board in which a first seed metal layer including a titanium (Ti) layer or a copper (Cu) layer is formed on an organic insulating material using a sputtering method, and a second seed metal layer is formed on the first seed metal layer and in a via hole using an electroless plating (e.g., chemical copper) method.

According to an aspect of the present disclosure, a printed circuit board may include: a first metal layer; an organic insulating layer covering at least a portion of the first metal layer and having a via hole exposing at least a portion of an upper surface of the first metal layer; a first seed metal layer disposed on an upper surface of the organic insulating layer; a second seed metal layer disposed on the first seed metal layer and extending onto a wall surface of the via hole and the exposed upper surface of the first metal layer; and a second metal layer disposed on the second seed metal layer and filling at least a portion of the via hole, wherein the first seed metal layer includes a first sputtering layer having titanium (Ti), and the second seed metal layer includes an electroless plating layer.

According to another aspect of the present disclosure, a printed circuit board may include: an organic insulating layer; a conductor pad disposed below the organic insulating layer; a wiring layer disposed on the organic insulating layer; and a conductor via penetrating through the organic insulating layer and connecting the wiring layer to the conductor pad, wherein the wiring layer includes a first seed metal layer including a first sputtering layer having titanium (Ti), a second seed metal layer disposed on the first seed metal layer and including an electroless plating layer, and a metal layer disposed on the second seed metal layer and including an electrolytic plating layer, and the conductor via includes the second seed metal layer and the metal layer.

According to still another aspect of the present disclosure, a printed circuit board may include: a first metal layer; an organic insulating layer disposed on the first metal layer; a second metal layer disposed on the organic insulating layer; a via protruding from a lower surface of the second metal layer and disposed in a via hole penetrating through the organic insulating layer; a first seed metal layer including a first sputtering layer having titanium (Ti) and comprising at least a portion disposed between an upper surface of the organic insulating layer and the lower surface of the second metal layer; and a second seed metal layer including an electroless plating layer and comprising at least a portion disposed between a wall surface of the via hole and the via.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
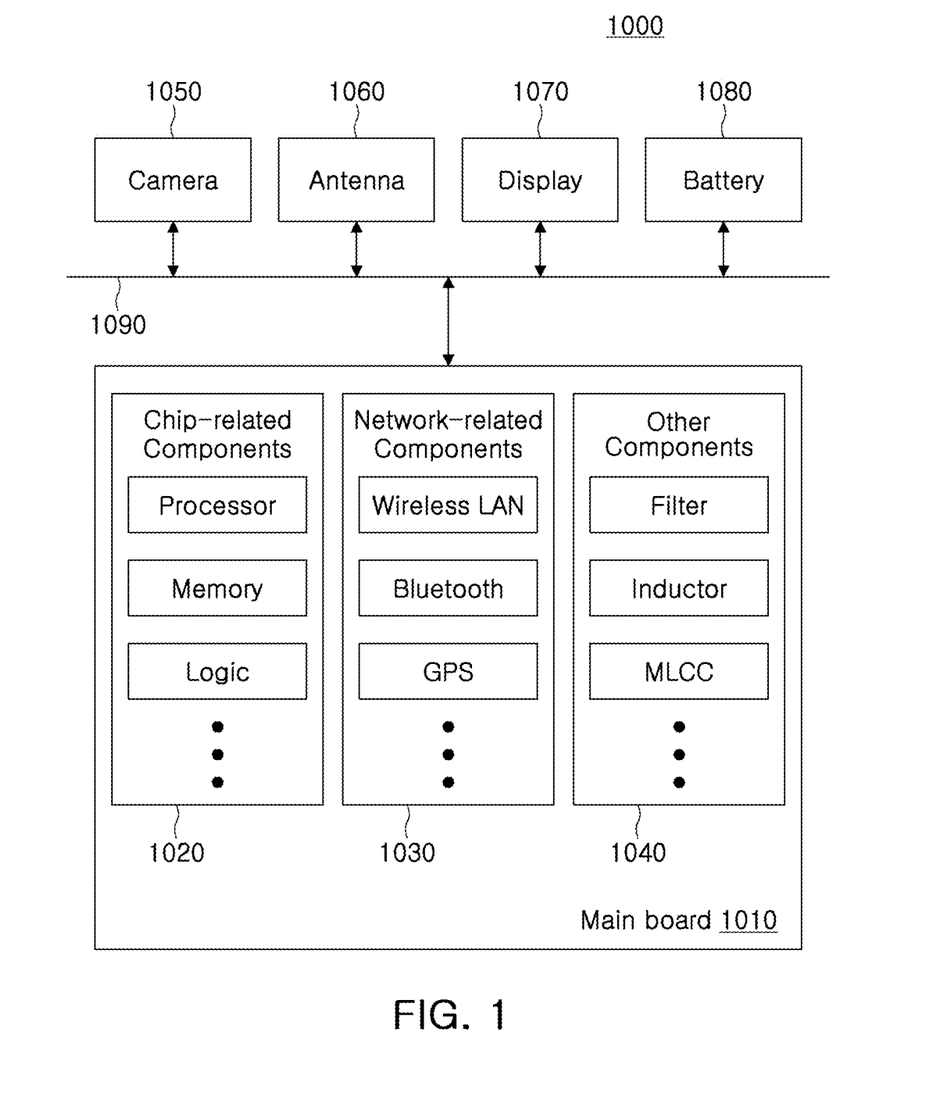
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010. The main board 1010 may include chip-related components 1020, network-related components 1030, other components 1040 and the like, which are physically or electrically connected thereto. These components may be connected to other electronic components described below to form various signal lines 1090.

The chip-related components 1020 may include a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphics processor (for example, a graphics processing unit (GPU)), a digital signal processor, a cryptographic processor, a microprocessor, or a microcontroller; and a logic chip such as an analog-to-digital (ADC) converter or an application-specific integrated circuit (ASIC). However, the chip-related components 1020 are not limited thereto, and may also include other types of chip-related components. In addition, the chip-related components 1020 may be combined with each other. The chip-related component 1020 may be a package including the above-mentioned chip or electronic component.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the above-mentioned protocols. However, the network-related components 1030 are not limited thereto, and may also include any of various other wireless or wired standards or protocols. In addition, the network-related components 1030 may be combined with the chip-related components 1020.

The other components 1040 may include a high frequency inductor, a ferrite inductor, a power inductor, ferrite beads, low temperature co-firing ceramics (LTCC), an electro magnetic interference (EMI) filter, a multi-layer ceramic condenser (MLCC) and the like. However, the other components 1040 are not limited thereto, and may further include a passive device in the form of a chip component used for various other purposes in addition to these components. In addition, the other components 1040 may be combined with the chip-related components 1020 or the network-related components 1030.

The electronic device 1000 may include another electronic component that may be or may not be physically or electrically connected to the main board 1010, based on a type of the electronic device 1000. Another electronic component may be a camera module 1050, an antenna module 1060, a display 1070, a battery 1080, etc. However, another electronic component is not limited thereto, and may be an audio codec, a video codec, a power amplifier, a compass, an accelerometer, a gyroscope, a speaker, a mass storage device (e.g., a hard disk drive), a compact disk (CD), a digital versatile disk (DVD), etc. In addition, another electronic component may be another electronic component used for various purposes, based on the type of the electronic device 1000.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive or the like. However, the electronic device 1000 is not limited thereto, and may also be any other electronic device processing data.

Figure 2:
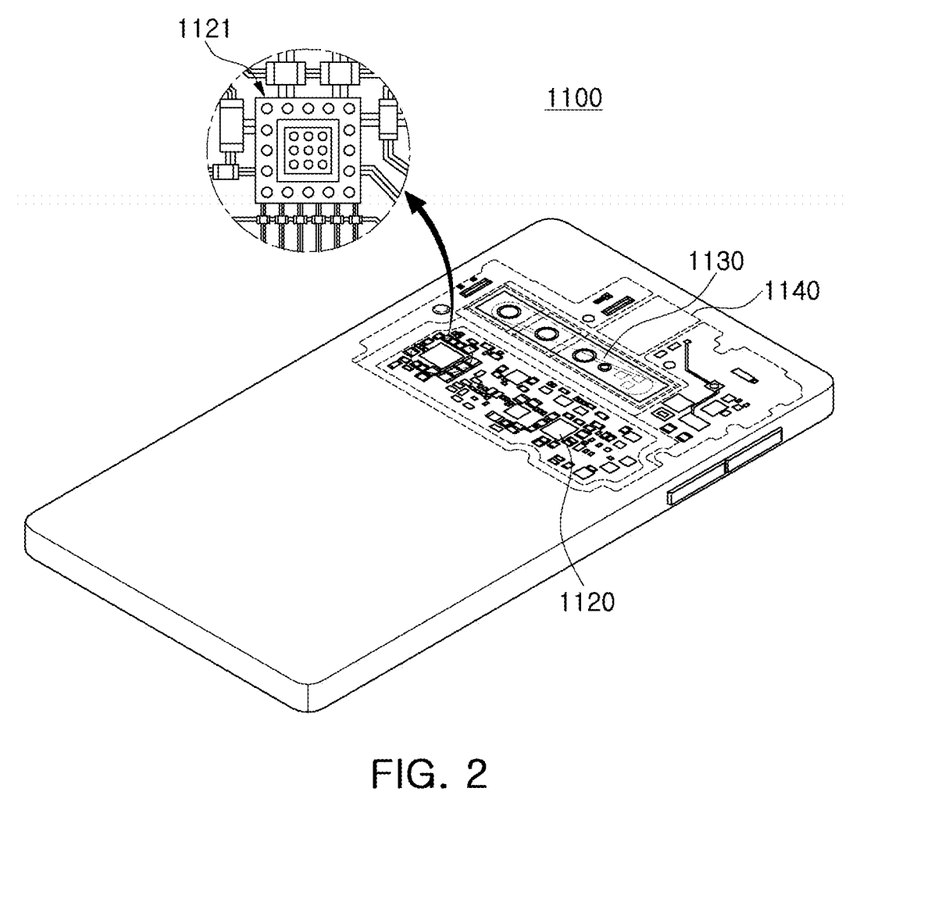
FIG. 2 is a perspective view schematically illustrating an example of an electronic device.

FIG. 2 is a perspective view schematically illustrating an example of an electronic device.

Referring to FIG. 2, the electronic device may be, for example, a smartphone 1100. The smartphone 1100 may accommodate a motherboard 1110, and various components 1120 may be physically or electrically connected to the motherboard 1110. In addition, the motherboard 1110 may accommodate other components that may or may not be physically or electrically connected thereto, such as the camera module 1130 or a speaker 1140. Some of the components 1120 may be the chip-related components, for example, a component package 1121, and are not limited thereto. The component package 1121 may be in the form of a printed circuit board on which electronic components including active components or passive components are surface mounted. Alternatively, the component package 1121 may be in the form of a printed circuit board in which the active components or the passive components are embedded. Meanwhile, the electronic device is not necessarily limited to the smartphone 1100, and may be another electronic device as described above.

Printed Circuit Board

Figure 3:
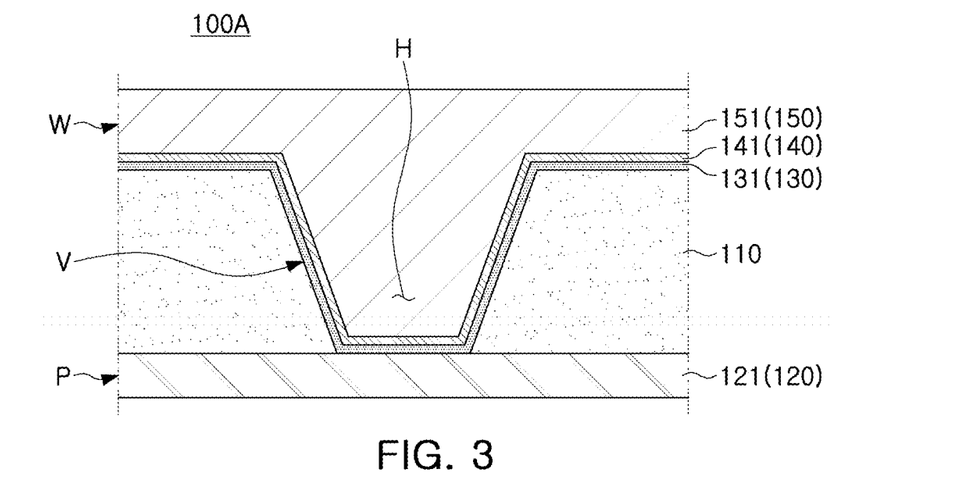
FIG. 3 is a cross-sectional view schematically illustrating a printed circuit board according to an exemplary embodiment.

FIG. 3 is a cross-sectional view schematically illustrating a printed circuit board according to an exemplary embodiment.

Referring to FIG. 3, a printed circuit board 100A according to an exemplary embodiment may include an organic insulating layer 110, a conductor pad P and a wiring layer W each disposed below and above the organic insulating layer 110, and a conductor via V passing through organic insulating layer 110 and connecting the wiring layer W to the conductor pad P. Here, the conductor pad P may include a first metal layer 120. In addition, the wiring layer W may include a first seed metal layer 130, a second seed metal layer 140, and a second metal layer 150. In addition, the conductor via V may include the first seed metal layer 130, the second seed metal layer 140, and the second metal layer 150.

For example, the printed circuit board 100A according to an exemplary embodiment may include: the first metal layer 120; the organic insulating layer 110 covering at least a portion of the first metal layer 120 and having a via hole H exposing at least a portion of an upper surface of the first metal layer 120; the first seed metal layer 130 disposed on an upper surface of the organic insulating layer 110; the second seed metal layer 140 disposed on the first seed metal layer 130 and extending onto a wall surface of the via hole H and the exposed upper surface of the first metal layer 120; and the second metal layer 150 disposed on the second seed metal layer 140 and filling at least a portion of the via hole H. Here, the first seed metal layer 130 may be in contact with at least a portion of the upper surface of the organic insulating layer 110, and may extend to be in contact with the via hole H and the exposed upper surface of the first metal layer 120. In addition, the second seed metal layer 140 may be disposed on the first seed metal layer 130 in the via hole H.

Meanwhile, the first seed metal layer 130 may include a first sputtering layer 131 having titanium (Ti), and the second seed metal layer 140 may include an electroless plating layer 141 including copper (Cu), for example, a chemical copper plating layer. Accordingly, it is possible to secure excellent adhesion with the organic insulating layer 110 through the first seed metal layer 130. In addition, it is possible to secure an excellent coverage property in the via hole H through the second metal layer 150. For example, it is possible to secure both the excellent adhesion with an organic insulating material and the excellent coverage property in the via hole by sequentially forming the first seed metal layer 130 including a sputtering layer having titanium (Ti) and the second seed metal layer 140 including an electroless plating layer including chemical copper in this order. If necessary, the electroless plating layer 141 may include a further metal material, other than copper (Cu). However, it may be more effective to have the above-mentioned effects that the electroless plating layer 141 includes copper (Cu), that is, the chemical copper layer. Components of the first and second seed metal layers 140 may be measured by a focused ion beam (FIB) analysis or a transmission electron microscope (TEM) analysis, based on a cut cross section of the printed circuit board 100A.

Meanwhile, the sputtering layer may be a layer formed based on a chemical bonding mechanism in which an unstable (e.g., high-energy) atomic metal in a plasma reacts with an organic material, thus securing the excellent adhesion regardless of roughness of the organic material. In addition, the electroless plating layer may be a layer formed based on a mechanism of depositing metal ions in a solution on the organic material, for example, a layer including chemical copper. As such, the electroless plating layer may be formed in a wet process, thus securing the excellent coverage property in the via hole.

How to check: What remains after a seed layer removal process is a lower part of a circuit pattern. It is possible to check the components of the corresponding layer by obtaining a cut surface of this part and performing a component analysis during the FIB or TEM analysis.

Hereinafter, the description describes the components of the printed circuit board 100A according to an exemplary embodiment in more detail with reference to the drawings.

The organic insulating layer 110 may include the organic insulating material. The organic insulating material may include a thermosetting resin such as an epoxy resin or a thermoplastic resin such as polyimide, or a material including an inorganic filler, an organic filler, or a glass fiber (i.e., glass fiber, glass cloth or glass fabric) together with this resin. The organic insulating material may be a photosensitive material or a non-photosensitive material. For example, the organic insulating layer 110 may use an insulating material such Ajinomoto build-up film (ABF), prepreg (PPG), or resin coated copper (RCC), is not limited thereto, and may also use photo imageable dielectric (PID). If necessary, the organic insulating layer 110 may use another polymer material having excellent rigidity. The organic insulating layer 110 may include Ajinomoto build-up film (ABF) or Ajinomoto build-up film (ABF) having low roughness, but is not limited thereto.

The conductor pad P may include a metal material. For example, the conductor pad P may include the first metal layer 120. The first metal layer 120 may include an electrolytic plating layer 121 including copper (Cu). However, the first metal layer 120 is not limited thereto, and may include the electroless plating layer (or chemical copper) and the electrolytic plating layer (or electrolytic copper). Alternatively, the first metal layer 120 may include a metal foil (or copper foil) and the electrolytic plating layer (or electrolytic copper). Alternatively, the first metal layer 120 may include the metal foil (or copper foil), the electroless plating layer (or chemical copper), and the electrolytic plating layer (or electrolytic copper). The first metal layer 120 may include the sputtering layer instead of the electroless plating layer (or chemical copper), or include both the layers, if necessary. Meanwhile, the electrolytic plating layer 121 may include a further metal material, other than copper (Cu). The conductor pad P may include a ground conductor pad, a power conductor pad, a signal conductor pad, or the like. Here, the signal conductor pad may include a conductor pad providing an electrical path for various signals other than the ground conductor pad, the power conductor pad, and the like, for example, a data signal. The conductor pad P may be electrically connected to a wiring layer, for example, a line pattern, disposed on the same layer.

The wiring layer W may include the metal material. For example, the wiring layer W may include the first seed metal layer 130 including the first sputtering layer 131 having titanium (Ti), the second seed metal layer 140 disposed on the first seed metal layer 130 and including the electroless plating layer 141 including copper (Cu), and the second metal layer 150 disposed on the second seed metal layer 140 and including an electrolytic plating layer 151 including copper (Cu). The electrolytic plating layer 151 may have a larger grain size than that of the electroless plating layer 141, and these two grain sizes may be analyzed and compared using the transmission electron microscope (TEM) based on the cut cross section of the printed circuit board 100A. Meanwhile, the electrolytic plating layer 151 may include a further metal material, other than copper (Cu). The wiring layer W may perform various functions based on a design thereof. For example, the wiring layer W may include a ground pattern, a power pattern, a signal pattern, or the like. Here, the signal pattern may include various signals other than the ground pattern, the power pattern, and the like, for example, the data signal. Each of these patterns may include the line pattern, a plane pattern, or a pad pattern. The pad pattern may include a land pattern.

The conductor via V may include the metal material. The conductor via V may be formed in the same process as the wiring layer W, and may thus be integrated with at least a portion of the wiring layer W. For example, the conductor via V may also include the first seed metal layer 130 including the first sputtering layer 131 having titanium (Ti), the second seed metal layer 140 disposed on the first seed metal layer 130 and including the electroless plating layer 141 including copper (Cu), and the second metal layer 150 disposed on the second seed metal layer 140 and including an electrolytic plating layer 151 including copper (Cu). Meanwhile, the electrolytic plating layer 151 may include a further metal material, other than copper (Cu). The conductor via V may be a filed via filling the via hole H, or may be a conformal via disposed along the wall surface of the via hole H. The conductor via V may perform various functions based on a design thereof. For example, the conductor via V may include a ground via, a power via, a signal via, or the like. Here, the signal via may include a via for transferring various signals other than the ground via, the power via, and the like, for example, the data signal.

Meanwhile, the structure of the printed circuit board 100A according to an exemplary embodiment as described above may be applied to at least a portion of a multilayer printed circuit board. For example, the above-mentioned organic insulating layer 110, conductor pad P, wiring layer W, conductor via V, and the like may be implemented in a multi-layered stacked form to be applied to the multilayer printed circuit board. In addition, the above-mentioned plurality of conductor pads P, wiring layers W, conductor vias V, and the like may be disposed in the above-mentioned organic insulating layer 110 at the same level. The multilayer printed circuit board may have various forms such as a coreless-type board and a core-type board. The multilayer printed circuit board may be a board for various purposes such as a package board.

Figure 4:
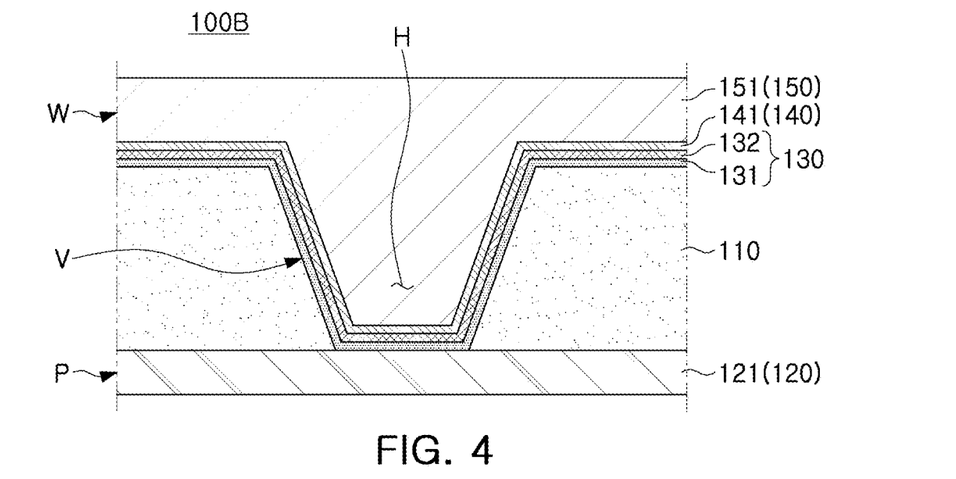
FIG. 4 is a cross-sectional view schematically illustrating a printed circuit board in another embodiment.

FIG. 4 is a cross-sectional view schematically illustrating a printed circuit board in another embodiment.

Referring to FIG. 4, compared to the above-described printed circuit board 100A according to an exemplary embodiment, in a printed circuit board 100B in another embodiment, the first seed metal layer 130 may further include a second sputtering layer 132 disposed on the first sputtering layer 131 and including copper (Cu). For example, the first seed metal layer 130 may include multiple sputtering layers. Meanwhile, the second sputtering layer 132 may be disposed between the first sputtering layer 131 and the electroless plating layer 141. For example, the electroless plating layer 141 of the second seed metal layer 140 that includes copper (Cu), for example, the chemical copper layer, may be disposed on the second sputtering layer 132 of the first seed metal layer 130 that includes copper (Cu). However, these two layers may be distinguished from each other even in this case. For example, the second sputtering layer 132 may include copper (Cu) without nickel (Ni), whereas the electroless plating layer 141 may further include nickel (Ni) in addition to copper (Cu). Nickel (Ni) may have a high concentration at a boundary with the material and may be found in most regions. Therefore, both the materials may be distinguished from each other by measuring a nickel (Ni) component. Meanwhile, the second sputtering layer 132 including copper (Cu) may further improve the adhesion between the first sputtering layer 131 including titanium (Ti) and the electroless plating layer 141 including copper (Cu). Other contents are substantially the same as those described in the above-described printed circuit board 100A according to an exemplary embodiment, and the description thus omits redundant descriptions thereof.

Figure 5:
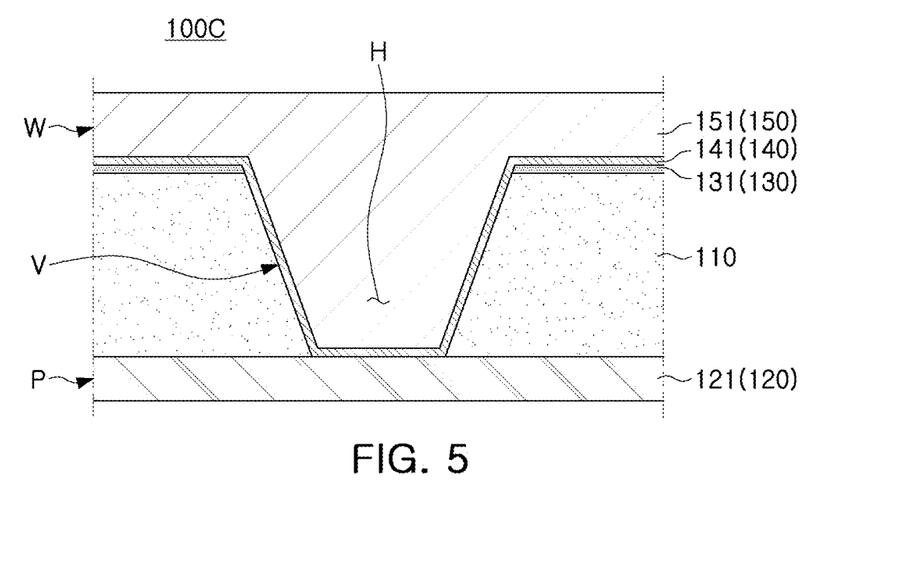
FIG. 5 is a cross-sectional view schematically illustrating a printed circuit board in still another embodiment.

FIG. 5 is a cross-sectional view schematically illustrating a printed circuit board in still another embodiment.

Referring to FIG. 5, compared to the above-mentioned printed circuit board 100A according to an exemplary embodiment, in a printed circuit board 100C in still another embodiment, the first seed metal layer 130 may not extend to be disposed inside the via hole H while being in contact with at least a portion of the upper surface of the organic insulating layer 110. Accordingly, the second seed metal layer 140 may be in contact with the wall surface of the via hole H and the exposed upper surface of the first metal layer 120. For example, the conductor via V may include the second seed metal layer 140 and the second metal layer 150, and may not include the first seed metal layer 130. For example, the first seed metal layer 130, for example, the first sputtering layer 131 including titanium (Ti) may be formed before processing the via hole H, and the second seed metal layer 140 and the second metal layer 150 may then be formed after processing the via hole H. In this case, it is possible to suppress occurrence of an interlayer void between the first sputtering layer 131 including titanium (Ti) and the first metal layer 120 including the electrolytic plating layer 121 in a chemical copper process. Other contents are substantially the same as those described in the above-described printed circuit board 100A according to an exemplary embodiment, and the description thus omits redundant descriptions thereof.

Figure 6:
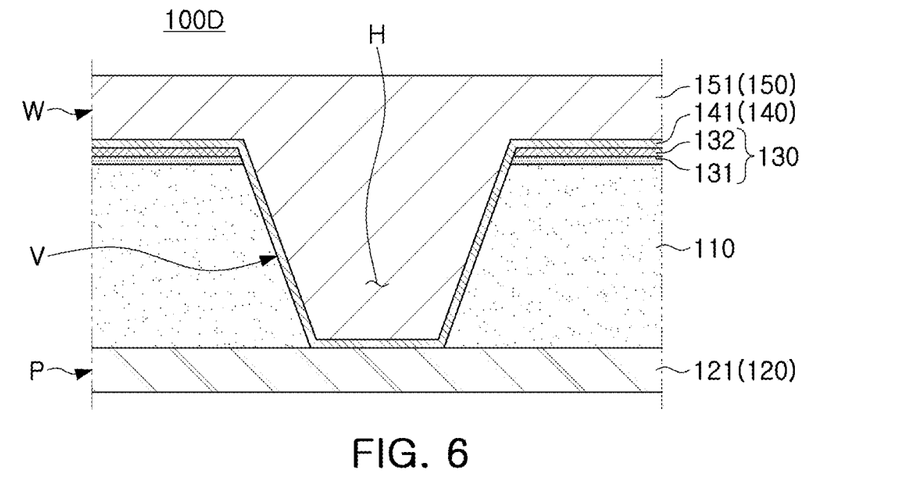
FIG. 6 is a cross-sectional view schematically illustrating a printed circuit board in yet another embodiment.

FIG. 6 is a cross-sectional view schematically illustrating a printed circuit board in yet another embodiment.

Referring to FIG. 6, compared to the above-mentioned printed circuit board 100B, in a printed circuit board 100D in yet another embodiment, the first seed metal layer 130 may not extend to be disposed inside the via hole H while being in contact with at least a portion of the upper surface of the organic insulating layer 110. Accordingly, the second seed metal layer 140 may be in contact with the wall surface of the via hole H and the exposed upper surface of the first metal layer 120. For example, the conductor via V may include the second seed metal layer 140 and the second metal layer 150, and may not include the first seed metal layer 130. For example, the first seed metal layer 130, for example, the first sputtering layer 131 including titanium (Ti) and the second sputtering layer 132 including copper (Cu) may be sequentially formed before processing the via hole H, and the second seed metal layer 140 and the second metal layer 150 may then be formed after processing the via hole H. In this case, it is possible to suppress the occurrence of the interlayer void between the first sputtering layer 131 including titanium (Ti) and the first metal layer 120 including the electrolytic plating layer 121 in the chemical copper process. Other contents are substantially the same as those described in the above-described printed circuit board 100A according to an exemplary embodiment and printed circuit board 100B in another embodiment, and the description thus omits redundant descriptions thereof.

Figure 7A:
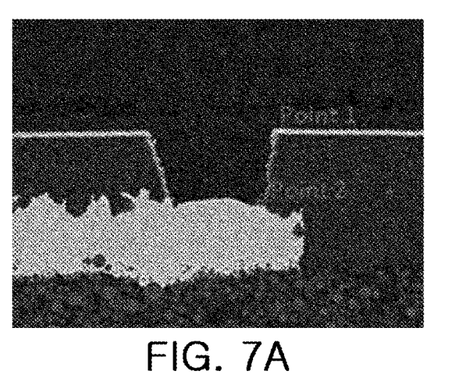
FIGS. 7A, 7B, and 7C are images schematically illustrating cases of forming a first sputtering layer including titanium (Ti) and a second sputtering layer including copper (Cu) as seed metal layers, respectively.
Figure 7B:
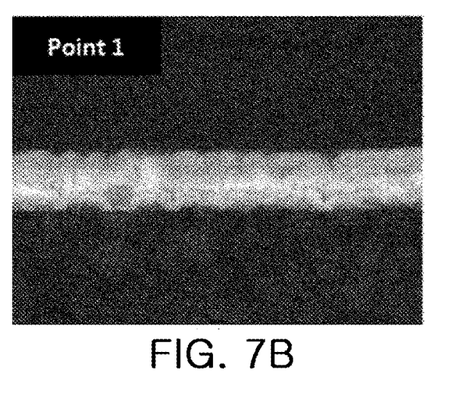
Figure 7C:
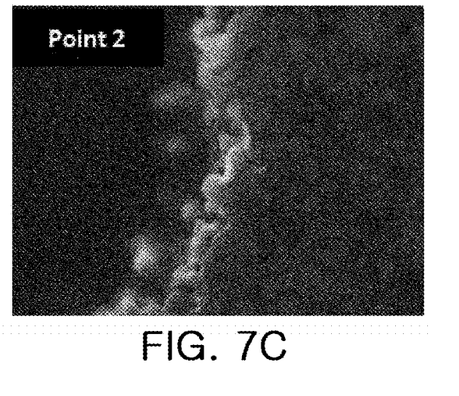

FIGS. 7A, 7B and 7C are images schematically illustrating cases of forming the first sputtering layer including titanium (Ti) and the second sputtering layer including copper (Cu) as the seed metal layers, respectively. Referring to FIGS. 7A, 7B and 7C, only the first sputtering layer including titanium (Ti) and the second sputtering layer including copper (Cu), that is, the multi-layer sputtering layer, may be formed as the seed metal layer. In this case, the adhesion with the organic insulating material such as ABF may be good, for example, about 0.84 kgf/cm. However, a direction in which the first and second sputtering layers are formed may be fixed to a certain direction, and a through power may thus be lower than that in a case of forming chemical copper, which is the electroless plating layer. Therefore, the coverage property may not be sufficient, such as breakage of the seed metal layer due to roughness of a processed surface in the via hole.

Figure 8A:
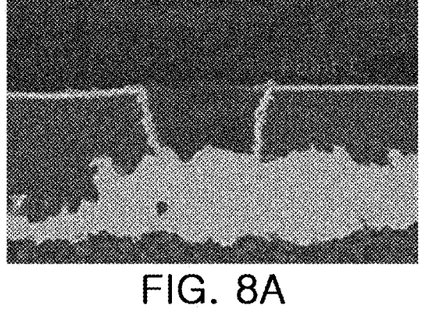
FIGS. 8A, 8B, and 8C are images schematically illustrating cases of forming a sputtering layer including titanium (Ti) and an electroless plating layer including copper (Cu) as the seed metal layers, respectively.
Figure 8B:
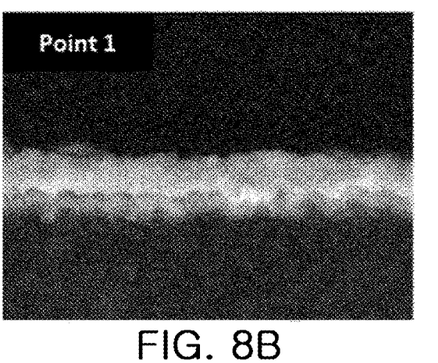
Figure 8C:
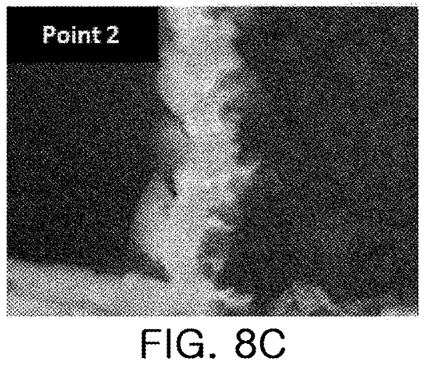

FIGS. 8A, 8B and 8C are images schematically illustrating cases of forming the sputtering layer including titanium (Ti) and the electroless plating layer including copper (Cu) as the seed metal layers, respectively.

Referring to FIGS. 8A, 8B and 8C, the sputtering layer including titanium (Ti) and the electroless plating layer including copper (Cu) may be all formed as the seed metal layers in this order. In this case, the adhesion with the organic insulating material such as ABF may be better, for example, about 0.61 kgf/cm, than the adhesion in a case of simply forming only chemical copper, which is the electroless plating layer, for example, about 0.2 kgf/cm. In addition, it is possible to secure a sufficient plating thickness at the bottom of the via hole, and have the excellent coverage property such as excellent connectivity of the seed metal layer even when the wall surface of the via hole is rough.

Figure 9A:
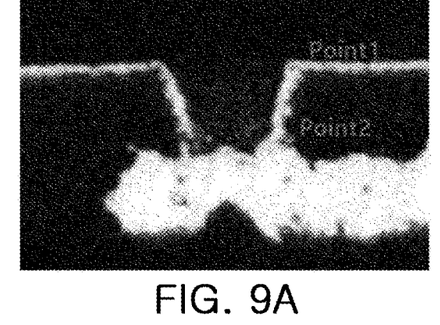
FIGS. 9A, 9B, and 9C are images schematically illustrating cases of forming the first sputtering layer including titanium (Ti), the second sputtering layer including copper (Cu), the electroless plating layer including copper (Cu) as the seed metal layers, respectively.
Figure 9B:
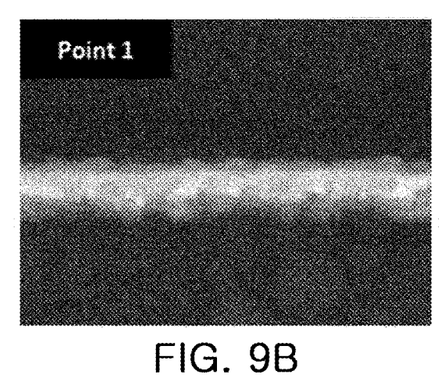
Figure 9C:
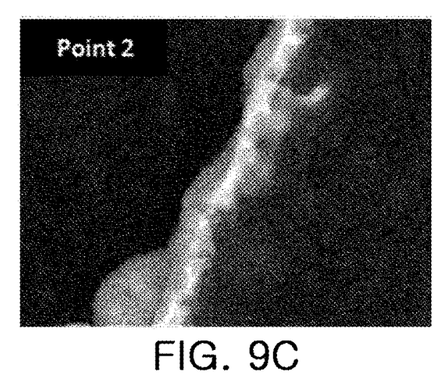

FIGS. 9A, 9B and 9C are images schematically illustrating cases of forming the first sputtering layer including titanium (Ti), the second sputtering layer including copper (Cu), the electroless plating layer including copper (Cu) as the seed metal layers, respectively.

Referring to FIGS. 9A, 9B and 9C, the first sputtering layer including titanium (Ti), the second sputtering layer including copper (Cu), and the electroless plating layer including copper (Cu) may be all formed as the seed metal layers in this order. In this case, the adhesion with the organic insulating material such as ABF may be better, for example, about 0.88 kgf/cm. Similarly, it is possible to simultaneously secure the sufficient plating thickness at the bottom of the via hole, and also have the excellent coverage property such as the excellent connectivity of the seed metal layer even when the wall surface of the via hole is rough.

Figure 10:
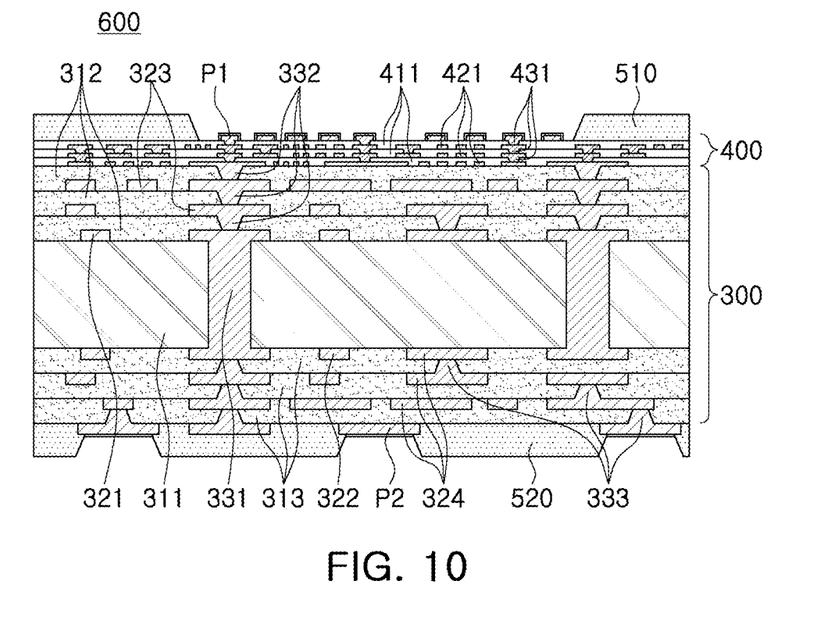
FIG. 10 is a cross-sectional view schematically illustrating a printed circuit board according to another exemplary embodiment

FIG. 10 is a cross-sectional view schematically illustrating a printed circuit board according to another exemplary embodiment.

Referring to FIG. 10, a printed circuit board 600 according to another exemplary embodiment may include a first board unit 300, a second board unit 400 disposed on the first board unit 300, a first resist layer 510 disposed on the second board unit 400, or a second resist layer 520 disposed on a surface of the first board unit 300 that is opposite to its surface on which the second board unit 400 is disposed. The first board unit 300 may be a general multilayer board, and the second board unit 400 may be a build-up board including a microcircuit formed on the first board unit 300. Here, the structure of the above-described printed circuit boards 100A, 100B, 100C, or 100D may be applied to a build-up wiring layer 421 or a connection via layer 431, included in the second board unit 400, which is the build-up board including the microcircuit. Here, the structure of the above-described printed circuit boards 100A, 100B, 100C, or 100D is not limited thereto, and may be applied to the build-up wiring layers 323 and 324 or connection via layers 332 and 333 of the first board unit 300, if necessary.

Meanwhile, the build-up wiring layer 421 included in the second board unit 400 may have a higher wiring density than core wiring layers 321 and 322 or the build-up wiring layers 323 and 324, included in the first board unit 300. For example, the build-up wiring layer 421 of the second board unit 400 may include a higher-density wiring with a relatively fine pitch, and the core wiring layers 321 and 322 or build-up wiring layers 323 and 324 of the first board unit 300 may each include a lower-density wiring. For example, the build-up wiring layer 421 of the second board unit 400 may have smaller wiring thickness, lines/space, pitch, or the like than the core wiring layers 321 and 322 or build-up wiring layers 323 and 324 of the first board unit 300. In addition, an insulation distance between the build-up wiring layers 421 disposed on different layers of the second board unit 400 may also be smaller than an insulation distance between the core wiring layers 321 and 322 or the build-up wiring layers 323 and 324, disposed on different layers of the first board unit 300.

Hereinafter, the description describes the components of the printed circuit board 600 a according to another exemplary embodiment in more detail with reference to the drawings.

The first board unit 300 may be a core-type multilayer board. For example, the first board unit 100 may include a core insulating layer 311, the first and second core wiring layers 321 and 322 respectively disposed on upper and lower surfaces of the core insulating layer 311, a through via layer 331 passing through the core insulating layer 311 and connecting the first and second core wiring layers 321 and 322 to each other, a plurality of first build-up insulating layers 312 disposed on the upper surface of the core insulating layer 311, the plurality of first build-up wiring layers 323 respectively disposed on or in the insulating layers 312, the plurality of first build-up plurality of first connection via layers 332 each passing through at least one of the plurality of first build-up insulating layers 312 and each connected to at least one of the plurality of first build-up wiring layers 323, a plurality of second build-up insulating layers 313 disposed on the lower surface of the core insulating layer 311, the plurality of second build-up wiring layers 324 respectively disposed on or in the plurality of second build-up insulating layers 313, and the plurality of second connection via layers 333 each passing through at least one of the plurality of second build-up insulating layers 313 and each connected to at least one of the plurality of second build-up wiring layers 324.

The core insulating layer 311 may include the insulating material. The insulating material may use a thermosetting resin such as an epoxy resin or a thermoplastic resin such as polyimide, a material in which this insulating resin is mixed with an inorganic filler such as silica, a resin impregnated into a core material such as a glass fiber (i.e., glass fiber, glass cloth or glass fabric) together with the inorganic filler, for example, copper clad laminate (CCL), or the like, and is not limited thereto. The core insulating layer 311 may have a thickness greater than each thickness of the first and second build-up insulating layers 312 and 313, and is not limited thereto.

Each of the first and second build-up insulating layers 312 and 313 may include the insulating material. The insulating material may use the thermosetting resin such as the epoxy resin or the thermoplastic resin such as the polyimide, the material in which this insulating resin is mixed with the inorganic filler such as silica, the resin impregnated into the core material such as the glass fiber (i.e., glass fiber, glass cloth or glass fabric) together with the inorganic filler, for example, Ajinomoto build-up film (ABF), prepreg, resin coated copper (RCC), or the like, and is not limited thereto. The first and second build-up insulating layers 312 and 313 are not limited to a specific number of layers, may have the same number of layers, and are not limited thereto.

The first and second core wiring layers 321 and 322 may each include a metal material. The metal material may use copper (Cu), aluminum (Al), silver (Ag), tin (Sn), gold (Au), nickel (Ni), lead (Pb), titanium (Ti), or alloys thereof. The first and second core wiring layers 321 and 322 may each include an electroless plating layer (or chemical copper) and the electrolytic plating layer (or electrolytic copper), and are not limited thereto. The first and second core wiring layers 321 and 322 may each include a sputtering layer instead of the electroless plating layer (or chemical copper), or include both the layers. In addition, the first and second core wiring layers 321 and 322 may each include a copper foil. The first and second core wiring layers 321 and 322 may perform various functions based on designs thereof. For example, the first and second core wiring layers 321 and 322 may each include a ground pattern, a power pattern, a signal pattern, or the like. Here, the signal pattern may include various signals other than the ground pattern, the power pattern, and the like, for example, a data signal. Each of these patterns may include a line pattern, a plane pattern, or a pad pattern.

Each of the first and second build-up wiring layers 323 and 324 may include the metal material. The metal material may use copper (Cu), aluminum (Al), silver (Ag), tin (Sn), gold (Au), nickel (Ni), lead (Pb), titanium (Ti), or alloys thereof. The first and second build-up wiring layers 323 and 324 may each include the electroless plating layer (or chemical copper) and the electrolytic plating layer (or electrolytic copper), and are not limited thereto. The first and second build-up wiring layers 323 and 324 may each include the sputtering layer instead of the electroless plating layer (or chemical copper), or include both the layers. In addition, the first and second build-up wiring layers 323 and 324 may each include the copper foil. The first and second build-up wiring layers 323 and 324 may each perform various functions based on designs thereof. For example, the first and second build-up wiring layers 323 and 324 may each include the ground pattern, the power pattern, the signal pattern, or the like. Here, the signal pattern may include various signals other than the ground pattern, the power pattern, and the like, for example, the data signal. Each of these patterns may include the line pattern, the plane pattern, or the pad pattern.

The through via layer 331 may include a through via. The through via may include a metal layer formed on a wall surface of a through hole and a plug filling the metal layer. The metal layer may include the metal material such as copper (Cu), aluminum (Al), silver (Ag), tin (Sn), gold (Au), nickel (Ni), lead (Pb), titanium (Ti), or alloys thereof. The plug may include ink including the insulating material. The metal layer may include the electroless plating layer (or chemical copper) and the electrolytic plating layer (or electrolytic copper), and is not limited thereto. The through via layer 331 may include the sputtering layer instead of the electroless plating layer (or chemical copper), or include both the layers. The through via layer 331 may perform various functions depending on a design thereof. For example, the through via layer 331 may include a ground via, a power via, a signal via, or the like. Here, the signal via may include a via for transferring various signals other than the ground via, the power via, and the like, for example, the data signal.

The first and second connection via layers 332 and 333 may include microvias. The microvia may be a filled via that fills a via hole or a conformal via that is disposed along a wall surface of the via hole. The microvias may be disposed in a stacked type or a staggered type. Each of the first and second connection via layers 332 and 333 may include the metal material, and the metal material may be copper (Cu), aluminum (Al), silver (Ag), tin (Sn), gold (Au), nickel (Ni), lead (Pb), titanium (Ti), or alloys thereof. The first and second connection via layers 332 and 333 may each include the electroless plating layer (or chemical copper) and the electrolytic plating layer (or electrolytic copper), and are not limited thereto. The first and second connection via layers 332 and 333 may each include the sputtering layer instead of the electroless plating layer (or chemical copper), or include both the layers. The first and second connection via layers 332 and 333 may each perform various functions based on designs thereof. For example, the first and second connection via layers 332 and 333 may each include the ground via, the power via, the signal via, or the like. Here, the signal via may include the via for transferring various signals other than the ground via, the power via, and the like, for example, the data signal.

The second board unit 400 may be the coreless-type multilayer build-up board including the microcircuit. For example, the second board unit 400 may include a plurality of third build-up insulating layers 411, the plurality of third build-up wiring layers 421 respectively disposed on or in the plurality of third build-up insulating layers 411, and a plurality of third connection via layers 431 each passing through at least one of the plurality of third build-up insulating layers 411 and each connected to at least one of the plurality of third build-up wiring layers 421.

The third build-up insulating layer 411 may include the insulating material. The insulating material may use the thermosetting resin such as the epoxy resin or the thermoplastic resin such as the polyimide, the material in which this insulating resin is mixed with the inorganic filler such as silica, the resin impregnated into the core material such as the glass fiber (i.e., glass fiber, glass cloth or glass fabric) together with the inorganic filler, for example, Ajinomoto build-up film (ABF), prepreg, resin coated copper (RCC), or the like, and is not limited thereto. The third build-up insulating layer 411 is not limited to a specific number of layers.

The third build-up wiring layer 421 may include the metal material. The metal material may use copper (Cu), aluminum (Al), silver (Ag), tin (Sn), gold (Au), nickel (Ni), lead (Pb), titanium (Ti), or alloys thereof. The third build-up wiring layer 421 may include the electroless plating layer (or chemical copper) and the electrolytic plating layer (or electrolytic copper), and is not limited thereto. The third build-up wiring layer 421 may include the sputtering layer instead of the electroless plating layer (or chemical copper), or include both the layers. In addition, the third build-up wiring layer 421 may include the copper foil. The third build-up wiring layer 421 may perform various functions based on a design thereof. For example, the third build-up wiring layer 421 may include the ground pattern, the power pattern, the signal pattern, or the like. Here, the signal pattern may include various signals other than the ground pattern, the power pattern, and the like, for example, the data signal. Each of these patterns may include the line pattern, the plane pattern, or the pad pattern.

The third connection via layer 431 may include the microvia. The microvia may be the filled via that fills the via hole or the conformal via that is disposed along the wall surface of the via hole. The microvias may be disposed in the stacked type or the staggered type. The third connection via layer 431 may include the metal material, and the metal material may include copper (Cu), aluminum (Al), silver (Ag), tin (Sn), gold (Au), nickel (Ni), lead (Pb), titanium (Ti), or alloys thereof. The third connection via layer 431 may include the electroless plating layer (or chemical copper) and the electrolytic plating layer (or electrolytic copper), and is not limited thereto. The third connection via layer 431 may include the sputtering layer instead of the electroless plating layer (or chemical copper), or include both the layers. The third connection via layer 431 may perform various functions based on a design thereof. For example, the third connection via layer 431 may include the ground via, the power via, the signal via, or the like. Here, the signal via may include the via for transferring various signals other than the ground via, the power via, and the like, for example, the data signal.

The first and second resist layers 510 and 520 may each include the insulating material, and the insulating material may use a liquid-type or film-type solder resist. However, the first or second resist layer 510 or 520 is not limited thereto, and may use another material. The first resist layer 510 may include a first opening h1 exposing at least a portion of each of a plurality of first outer pads P1 disposed on an upper surface of the uppermost build-up wiring layer of the second board unit 400. For example, one first opening h1 may expose at least a portion of each of the plurality of first outer pads P1. A first surface treatment layer may be formed on each of the plurality of first outer pads P1 exposed through each first opening h1. Each of the first surface treatment layers may cover the upper surface and side surface of each of the first outer pads P1. The second resist layer 520 may include a plurality of second openings h2 each exposing at least a portion of each of a plurality of second outer pads P2 disposed on a lower surface of the lowermost build-up wiring layer of the first board unit 300. For example, the plurality of second openings h2 may each expose at least a portion of each of the plurality of second outer pads P2. A second surface treatment layer may be formed on each of the plurality of second outer pads P2 exposed through each second opening h2. Each of the second surface treatment layers may cover a lower surface of each of the second outer pads P2.

As set forth above, the present disclosure may provide the printed circuit board including the organic insulating layer and the seed metal layer which may have the high adhesion and simultaneously have the excellent coverage property in the via hole.

In the present disclosure, a meaning of the expression, "substantially," may be determined by including a process error, a positional deviation, an error in measurement, and the like that occur in the process. In addition, connection between two components conceptually includes their indirect connection through a third component as well as their direct connection. In addition, it may be understood that when an element is referred to with terms such as "first" and "second," the element is not limited thereby. These terms are used only to distinguish the element from another element, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize each particular feature different from that of another exemplary embodiment. However, the exemplary embodiments provided herein may be implemented in combination with features of another exemplary embodiment. For example, a description of an element in a specific exemplary embodiment may be understood as its description in another exemplary embodiment even though the element is not described in another exemplary embodiment, unless an opposite or contradictory description is provided therein.

The terms used herein are used only to describe an exemplary embodiment rather than limiting the present disclosure. Here, a term of a singular number includes its plural number unless explicitly interpreted otherwise in context.

While the exemplary embodiments have been shown and described above, it will be apparent to those skilled in the art that modifications and variations could be made without departing from the scope of the present disclosure as defined by the appended claims.

What is claimed is:

1. A printed circuit board, the board comprising:
   a first metal layer;
   an organic insulating layer covering at least a portion of the first metal layer and having a via hole exposing at least a portion of an upper surface of the first metal layer;
   a first seed metal layer disposed on an upper surface of the organic insulating layer;
   a second seed metal layer disposed on the first seed metal layer and extending onto a wall surface of the via hole and the exposed upper surface of the first metal layer; and
   a second metal layer disposed on the second seed metal layer and filling at least a portion of the via hole,
   wherein the first seed metal layer includes a first sputtering layer having titanium (Ti), and the second seed metal layer includes an electroless plating layer, and the electroless plating layer further includes nickel (Ni) in addition to copper (Cu); and wherein the second seed metal layer is a single continuous layer comprising copper (Cu) and nickel (Ni), with nickel distributed within the layer across its thickness, and the second seed metal layer being free of any internal copper/nickel interface or discrete nickel sub-layer.

2. The board of claim 1, wherein the first seed metal layer is in contact with at least a portion of the upper surface of the organic insulating layer and extends to be in contact with the wall surface of the via hole and the exposed upper surface of the first metal layer, and the second seed metal layer is disposed on the first seed metal layer in the via hole.

3. The board of claim 1, wherein the first seed metal layer is in contact with at least a portion of the upper surface of the organic insulating layer, and does not extend to be disposed inside the via hole, and the second seed metal layer is in contact with the wall surface of the via hole and the exposed upper surface of the first metal layer.

4. The board of claim 1, wherein the first seed metal layer further includes a second sputtering layer including copper (Cu), and the second sputtering layer is disposed on the first sputtering layer.

5. The board of claim 4, wherein the second sputtering layer does not include nickel (Ni).

6. The board of claim 4, wherein the first seed metal layer is in contact with at least a portion of the upper surface of the organic insulating layer and extends to be in contact with the wall surface of the via hole and the exposed upper surface of the first metal layer, and the second seed metal layer is disposed on the first seed metal layer in the via hole.

7. The board of claim 4, wherein the first seed metal layer is in contact with at least a portion of the upper surface of the organic insulating layer, and does not extend to be disposed inside the via hole, and the second seed metal layer is in contact with the wall surface of the via hole and the exposed upper surface of the first metal layer.

8. The board of claim 1, wherein the second metal layer includes the electrolytic plating layer including copper (Cu).

9. The board of claim 1, wherein the organic insulating layer includes Ajinomoto build-up film (ABF).

10. A printed circuit board, the board comprising:
    an organic insulating layer;
    a conductor pad disposed below the organic insulating layer;
    a wiring layer disposed on the organic insulating layer; and
    a conductor via penetrating through the organic insulating layer and connecting the wiring layer to the conductor pad,
    wherein the wiring layer comprises a first seed metal layer including a first sputtering layer having titanium (Ti), a second seed metal layer disposed on the first seed metal layer and including an electroless plating layer, and a metal layer disposed on the second seed metal layer and including an electrolytic plating layer, and,
    wherein the electroless plating layer further includes nickel (Ni) in addition to copper (Cu); and wherein the second seed metal layer is a single continuous layer comprising copper (Cu) and nickel (Ni), with nickel distributed within the layer across its thickness, and the second seed metal layer being free of any internal copper/nickel interface or discrete nickel sub-layer and the electrolytic plating layer includes copper (Cu), and the conductor via includes the second seed metal layer and the metal layer.

11. The board of claim 10, wherein the first seed metal layer further includes a second sputtering layer having copper (Cu), and the second sputtering layer is disposed on the first sputtering layer.

12. The board of claim 11, wherein the second sputtering layer does not include nickel (Ni).

13. The board of claim 10, wherein the conductor via further includes the first seed metal layer.

14. The board of claim 13, wherein the first seed metal layer further includes a second sputtering layer having copper (Cu), and the second sputtering layer is disposed on the first sputtering layer.

15. The board of claim 14, wherein the second sputtering layer does not include nickel (Ni), the electroless plating layer further includes nickel (Ni) in addition to copper (Cu), and the electrolytic plating layer includes copper (Cu).

16. A printed circuit board, the board comprising:
a first metal layer;
an organic insulating layer disposed on the first metal layer;
a second metal layer disposed on the organic insulating layer;
a via protruding from a lower surface of the second metal layer and disposed in a via hole penetrating through the organic insulating layer;
a first seed metal layer including a first sputtering layer having titanium (Ti) and comprising at least a portion disposed between an upper surface of the organic insulating layer and the lower surface of the second metal layer; and
a second seed metal layer including an electroless plating layer and comprising at least a portion disposed between a wall surface of the via hole and the via,
wherein the electroless plating layer further includes nickel (Ni) in addition to copper (Cu); and wherein the second seed metal layer is a single continuous layer comprising copper (Cu) and nickel (Ni), with nickel distributed within the layer across its thickness, and the second seed metal layer being free of any internal copper/nickel interface or discrete nickel sub-layer.

17. The board of claim 16, wherein the first seed metal layer is in contact with at least a portion of the upper surface of the organic insulating layer and extends to be in contact with the wall surface of the via hole and an exposed upper surface of the first metal layer, and the second seed metal layer is disposed on the first seed metal layer in the via hole.

18. The board of claim 16, wherein the first seed metal layer is in contact with at least a portion of the upper surface of the organic insulating layer, and does not extend to be disposed inside the via hole, and
the second seed metal layer is in contact with the wall surface of the via hole and an exposed upper surface of the first metal layer.

19. The board of claim 16, wherein the first seed metal layer further includes a second sputtering layer having copper (Cu), and the second sputtering layer is disposed on the first sputtering layer and covered by the second metal layer.

20. The board of claim 19, wherein the second sputtering layer is disposed between an upper surface of the first sputtering layer and the lower surface of the second metal layer, and does not extend to be disposed inside the via hole.

* * * * *